US012452564B2

(12) United States Patent
Ren

(10) Patent No.: US 12,452,564 B2
(45) Date of Patent: Oct. 21, 2025

(54) ELECTRONIC TIMER SOCKET AND TIMING SETTING METHOD THEREOF

(71) Applicant: ZHENGZHOU DEWENWILS NETWORK TECHNOLOGY CO., LTD., Zhengzhou (CN)

(72) Inventor: Yuan Ren, Zhengzhou (CN)

(73) Assignee: ZHENGZHOU DEWENWILS NETWORK TECHNOLOGY CO., TLD., Zhengzhou (CN)

(*) Notice: Subject to any disclaimer, the term of this patent is extended or adjusted under 35 U.S.C. 154(b) by 239 days.

(21) Appl. No.: 18/187,877

(22) Filed: Mar. 22, 2023

(65) Prior Publication Data

US 2024/0251188 A1 Jul. 25, 2024

(30) Foreign Application Priority Data

Jan. 19, 2023 (CN) ......................... 202310088634.6

(51) Int. Cl.
*H04Q 9/02* (2006.01)
*G01R 31/3835* (2019.01)
*G06F 3/147* (2006.01)

(52) U.S. Cl.
CPC ........... *H04Q 9/02* (2013.01); *G01R 31/3835* (2019.01); *G06F 3/147* (2013.01); *H04Q 2209/823* (2013.01)

(58) Field of Classification Search
CPC ................ G06F 3/147; G01R 31/3835; H04Q 2209/823; H04Q 9/02; H01H 7/00; H01H 43/00; H01H 43/02; H01H 43/04; H01H 9/16; H01H 9/161; H01H 9/18; H01H 9/181; H01H 2009/16; H01H 2009/161; H01H 2009/164; H01H 2009/18; H01H 13/24; H01H 15/20; H01H 19/26; H01H 21/52; H01H 23/22; H01H 29/08; H01H 43/028; H01H 43/08; H01H 43/24; H01H 37/62; H01H 2043/00; H01H 2059/00; H01H 2059/0063
USPC ........................................................ 200/19.04
See application file for complete search history.

(56) References Cited

U.S. PATENT DOCUMENTS

| | | | | |
|---|---|---|---|---|
| 4,829,290 A * | 5/1989 | Ford | H02J 7/0047 | 340/636.15 |
| 7,956,496 B1 * | 6/2011 | Pasley | H01H 43/04 | 307/141 |
| 9,762,056 B1 * | 9/2017 | Miller | H01R 25/003 | |

* cited by examiner

*Primary Examiner* — Anthony R Jimenez
(74) *Attorney, Agent, or Firm* — Westbridge IP LLC

(57) ABSTRACT

Disclosed are an electronic timer socket and a timing setting method thereof. A user-defined timing mode, a Daily timing mode, a 7-Day cycle timing mode, a CTD timing mode and a normally-on/normally-off timing mode are provided through key setting, and a two-way socket circuit may be independently controlled to be turned on or off through the above modes, so that the advantages of simple setting and convenience for operation are achieved, the learning difficulty of using products is reduced, and greater convenience is brought for the public to use. Through the above-mentioned modes and a multi-mode parallel or serial discrimination rule, the two-way socket circuit may be independently controlled to be turned on or off, which has the advantages of simple setting and convenience for operation, making the use of the timer socket more flexible and more suitable for more scenarios.

8 Claims, 3 Drawing Sheets

ELECTRONIC TIMER SOCKET AND TIMING SETTING METHOD THEREOF

CROSS-REFERENCE TO RELATED APPLICATIONS

This application claims priority to Chinese Patent Application No. 202310088634.6, filed on Jan. 19, 2023, the content of which is incorporated herein by reference in its entirety.

TECHNICAL FIELD

The application relates to the technical field of electronic timing remote controls, in particular to an electronic timer socket and a timing setting method thereof.

BACKGROUND

An electronic timer socket is a socket product which is controlled by a chip and may be set to turn on and off the power in a specific time period. Main components thereof include a trigger socket, a relay, a relay control circuit and a timing circuit. In addition to a jack, there is a display screen and a timing setting key on a casing. When the socket is needed in a certain time period, timing time may be set through the display screen and the timing setting key. When the time is up, the relay control circuit may receive a control signal to turn a socket circuit on or off. The electronic timer socket is accurate in timing, low in failure rate and sensitive in action.

A timing setting procedure of the electronic timer socket is generally as follows: 1. A "set" key is pressed to enter a timing mode for setting, and the screen displays "1 ON". 2. "Hour", "minute" and "week" are pressed, that is, the time when a first group of timing starts to work. The "week" key is pressed so that different week combination modes can be selected. The timer may only work in the set number of weeks as required; 3. The "set" key is pressed again, and the screen displays "1 OFF", that is, the time when the first group of timing is turned off. For time setting, the setting method of 1 ON may be referred to. By analogy, multiple groups of ON and OFF may be set. 4. After setting, a "clock" key is pressed to return to the current time.

The existing electronic timer socket has the following defects that: if multiple groups do not need to be set every day, but other groups have been set, a "clear" key must be pressed to clear the time program of the redundant groups. After timing setting is completed, the "set" key is pressed to check whether the timing setting for several times is consistent with an actual situation. If there is any difference, adjustment or resetting is performed according to time needs.

SUMMARY

The application provides an electronic timer socket and a timing setting method thereof. A two-way socket circuit may be independently controlled to be turned on or off through a multi-mode parallel or serial discrimination rule, so that the advantages of simple setting and convenience for operation are achieved, making the use of the timer socket more flexible and more suitable for more scenarios.

In order to solve the above-mentioned technical problem, the application provides an electronic timer socket, which may include a battery, a key, a controller, a relay, a relay control circuit and an Alternating Current/Direct Current (AC/DC) conversion circuit. The battery is connected to the Micro-Controller Unit (MCU) controller through a battery voltage monitoring circuit, and the key, an Liquid Crystal Display (LCD) screen and the relay control circuit are connected to the MCU controller.

The battery is configured to supply power to the MCU controller.

The AC/DC conversion circuit is configured to convert alternating current into direct current, input the direct current to the MCU controller and charge the battery at the same time.

The MCU controller is configured to detect the state of the key, acquire current time, perform logical judgment based on the state of the key, the current time and a preset timing mode, determine a light-on state of the relay based on a logical judgment result, and send a state instruction to the relay control circuit.

The relay control circuit is configured to control and change an on-off state of the corresponding relay based on the state instruction, so as to control the on/off state of the socket.

Preferably, the battery voltage monitoring circuit, the LCD screen, a memory chip and an interface circuit are further included.

The battery voltage monitoring circuit is configured to monitor battery voltage, judge whether a low-voltage alarm is needed or not, and if so, send the low-voltage alarm to the MCU controller so as to enable the MCU controller to execute corresponding alarm operation. The alarm operation includes that: if the battery is less than 10%, the LCD screen is controlled to display a low-power icon and blink; and if the battery is less than 5%, the LCD screen is controlled to display the low-power icon and blink quickly until the battery is replaced.

The interface circuit is connected with the MCU controller, and the key is connected with the MCU controller through the interface circuit.

The LCD screen is connected with the MCU controller, and is configured to display timer time and operation state.

The memory chip is configured to store the preset timing mode and a mode parameter.

Preferably, the timing mode includes a user-defined timing mode, a Daily timing mode, a 7-Day cycle timing mode, a Count down (CTD) timing mode and a normally-on/normally-off timing mode.

The user-defined timing mode is configured to set the on/off state by itself.

The Daily timing mode is configured to set the daily on/off state.

The 7-Day cycle timing mode is configured to set the on/off state from Monday to Sunday.

The CTD timing mode is configured to perform sampling according to a set sampling frequency and then enter the on/off state within a set time interval.

Preferably, the logical judgment includes a multi-mode parallel or serial discrimination rule. The multi-mode parallel or serial discrimination rule includes the following operations.

The user-defined timing mode is capable of being used in the Daily timing mode and the 7-Day cycle timing mode.

The Daily timing mode is mutually exclusive with the 7-Day cycle timing mode and the normally-on/normally-off timing mode, and when the Daily timing mode is activated, the 7-Day cycle timing mode or the normally-on/normally-off timing mode is automatically exited.

The 7-Day cycle timing mode is mutually exclusive with the Daily timing mode and the normally-on/normally-off timing mode, and when the 7-Day cycle timing mode is activated, the Daily timing mode or the normally-on/normally-off timing mode is automatically exited.

The CTD timing mode is capable of operating parallel to the Daily timing mode, the 7-Day cycle timing mode and the user-defined timing mode, and the user-defined timing mode, the Daily timing mode, the 7-Day cycle timing mode and the CTD timing mode are capable of being activated at the same time.

The CTD timing mode and the normally-on/normally-off timing mode are mutually exclusive, and when the normally-on/normally-off timing mode is used, the CTD timing mode is automatically exited.

When the CTD timing mode and the user-defined timing mode are activated at the same time, execution is performed according to the function of the user-defined timing mode.

When the user-defined timing mode, the Daily timing mode, the 7-Day cycle timing mode and the CTD timing mode are in an active state, the normally-on/normally-off timing mode is triggered, and the normally-on/normally-off timing mode is directly executed.

The application also provides a timing setting method of an electronic timer socket, which may include the following operations.

At S1, an MCU controller acquires current time and acquires a press state of a key through an interface circuit.

At S2, the MCU controller performs logical judgment based on the current time, the press state, a pre-stored timing mode and a timing parameter, determines a light-on state of a relay based on a logical judgment result, and sends a state instruction to a relay control circuit so as to control an on/off state of the socket through on/off of the relay.

Preferably, in S1, the operation that the MCU controller acquires the current time further includes the following operation.

The current time is updated/set, the updated/set current time is sent to the MCU controller for storage, and the MCU controller displays a time value on an LCD screen based on the current time.

Preferably, after the MCU controller displays the time value on the LCD screen based on the current time, the following operations are further included.

The timing mode and the timing parameter are determined based on a key signal of the key to determine a one-way socket needing timing setting, the timing mode is set as a user-defined timing mode, a Daily timing mode, a 7-Day cycle timing mode, a CTD timing mode or a normally-on/normally-off timing mode based on a multi-mode parallel or serial discrimination rule, and the timing mode and the timing parameter are sent to the MCU controller and stored to a memory chip.

Preferably, the multi-mode parallel or serial discrimination rule includes the following operations.

The user-defined timing mode is capable of being used in the Daily timing mode and the 7-Day cycle timing mode.

The Daily timing mode is mutually exclusive with the 7-Day cycle timing mode and the normally-on/normally-off timing mode, and when the Daily timing mode is activated, the 7-Day cycle timing mode or the normally-on/normally-off timing mode is automatically exited.

The 7-Day cycle timing mode is mutually exclusive with the Daily timing mode and the normally-on/normally-off timing mode, and when the 7-Day cycle timing mode is activated, the Daily timing mode or the normally-on/normally-off timing mode is automatically exited.

The CTD timing mode is capable of operating parallel to the Daily timing mode, the 7-Day cycle timing mode and the user-defined timing mode, and the user-defined timing mode, the Daily timing mode, the 7-Day cycle timing mode and the CTD timing mode are capable of being activated at the same time.

The CTD timing mode and the normally-on/normally-off timing mode are mutually exclusive, and when the normally-on/normally-off timing mode is used, the CTD timing mode is automatically exited.

When the CTD timing mode and the user-defined timing mode are activated at the same time, execution is performed according to the function of the user-defined timing mode.

When the user-defined timing mode, the Daily timing mode, the 7-Day cycle timing mode and the CTD timing mode are in an active state, the normally-on/normally-off timing mode is triggered, and the normally-on/normally-off timing mode is directly executed.

Preferably, S2 specifically includes the following operations.

At S21, the MCU controller acquires the timing mode and the timing parameter from the memory chip through the relay control circuit. The timing parameter includes timing time.

At S22, the MCU controller monitors battery voltage, judges whether a low-voltage alarm is needed or not, and if so, sends the low-voltage alarm to the MCU controller so as to enable the MCU controller to execute corresponding alarm operation. The alarm operation includes that: if the battery is less than 10%, the LCD screen is controlled to display a low-power icon and blink; and if the battery is less than 5%, the LCD screen is controlled to display the low-power icon and blink quickly until the battery is replaced.

At S23, the MCU controller performs logical judgment on the timing mode, the current time and the timing parameter, if the current time reaches the timing time, proceeding to S24, otherwise returning to S21.

At S24, the MCU controller determines the light-on state of the relay based on the logical judgment result and sends the state instruction to the relay control circuit; and the relay control circuit changes the on-off state of the corresponding relay based on the state instruction so as to control the on/off state of the socket.

The application provides an electronic timer socket and a timing setting method thereof. The user-defined timing mode, the Daily timing mode, the 7-Day cycle timing mode, the CTD timing mode and the normally-on/normally-off timing mode are provided through key setting, and a two-way socket circuit may be independently controlled to be turned on or off through the above modes, so that the advantages of simple setting and convenience for operation are achieved, the learning difficulty of using products is reduced, and greater convenience is brought for the public to use. Through the above-mentioned modes and the multi-mode parallel or serial discrimination rule, the two-way socket circuit may be independently controlled to be turned on or off, which has the advantages of simple setting and convenience for operation, making the use of the timer socket more flexible and more suitable for more scenarios.

BRIEF DESCRIPTION OF THE DRAWINGS

In order to more clearly explain the technical solutions in the embodiments of the application or in a traditional art, the drawings required in the descriptions of the embodiments or the traditional art will be briefly introduced below. It is apparent that the drawings in the following descriptions are some embodiments of the application. Those of ordinary skill in the art may also obtain other drawings in accordance with these drawings without paying creative labor.

DETAILED DESCRIPTION OF THE EMBODIMENTS

Figure 1:
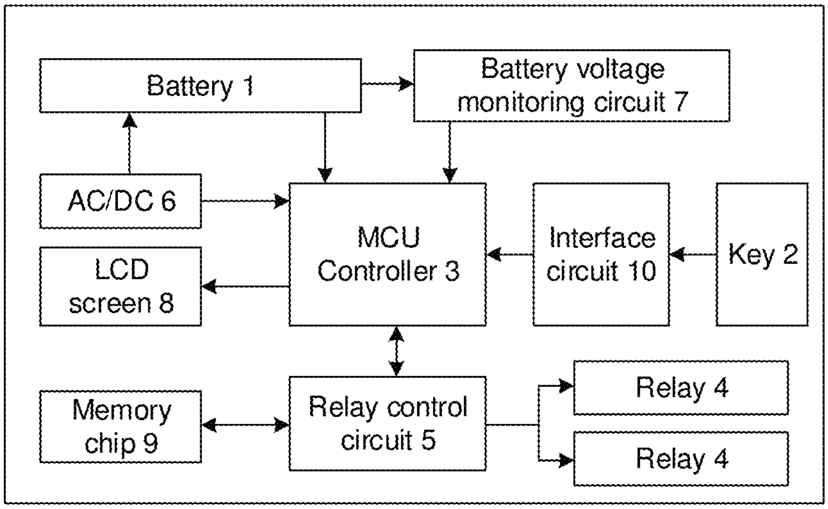
FIG. 1 is a schematic structural diagram of an electronic timer socket according to an embodiment of the application.

In order to make the purposes, technical solutions and advantages of the embodiments of the application clearer, the technical solutions in the embodiments of the application will be clearly and completely described below in combination with the drawings in the embodiments of the application, and it is apparent that the described embodiments are only a part rather all of embodiments of the application. All other embodiments obtained by those of ordinary skill in the art on the basis of the embodiments in the application without creative work shall fall within the scope of protection of the application.

The term "and/or" in the embodiments of the application describes only an association relationship for describing associated objects and represents that three relationships may exist. For example, A and/or B may represent the following three cases: only A exists, both A and B exist, or only B exists.

Terms "first" and "second" in the embodiments of the application are only used for describing purposes, and cannot be understood as indicating or implying relative importance or implicitly indicating the number of indicated technical features. Therefore, the features defined with "first" and "second" may include at least one of the features explicitly or implicitly. In the description of the application, terms "include" and "have" and any variations thereof are intended to cover non-exclusive inclusion. For example, a system, product or device including a series of components or units is not limited to the components or units which are listed, but may alternatively further include components or units which are not listed or alternatively further include other components or units intrinsic to the product or device. In the descriptions of the application, "multiple" means at least two, for example, two and three, unless otherwise limited definitely and specifically.

Reference to an "embodiment" herein means that a particular feature, structure or characteristic described in connection with an embodiment may be included in at least one embodiment of the application. The appearance of this phrase in various places in the specification does not necessarily mean the same embodiment, nor is it an independent or alternative embodiment mutually exclusive with other embodiments. Those skilled in the art understand explicitly and implicitly that the embodiments described herein may be combined with other embodiments.

An existing electronic timer socket has the following defects that: if multiple groups do not need to be set every day, but other groups have been set, a "clear" key must be pressed to clear the time program of the redundant groups. After timing setting is completed, A "set" key is pressed to check whether the timing setting for several times is consistent with an actual situation. If there is any difference, adjustment or resetting is performed according to time needs.

Therefore, the embodiments of the application provide an electronic timer socket and a timing setting method thereof. A user-defined timing mode, a Daily timing mode, a 7-Day cycle timing mode, a CTD timing mode and a normally-on/normally-off timing mode are provided through key setting, and a two-way socket circuit may be independently controlled to be turned on or off through the above-mentioned modes and a multi-mode parallel or serial discrimination rule, so that the advantages of simple setting and convenience for operation are achieved, making the use of the timer socket more flexible and more suitable for more scenarios. The electronic timer socket and the timing setting method according to the embodiments of the application are described below with reference to the accompanying drawings.

Figure 2:
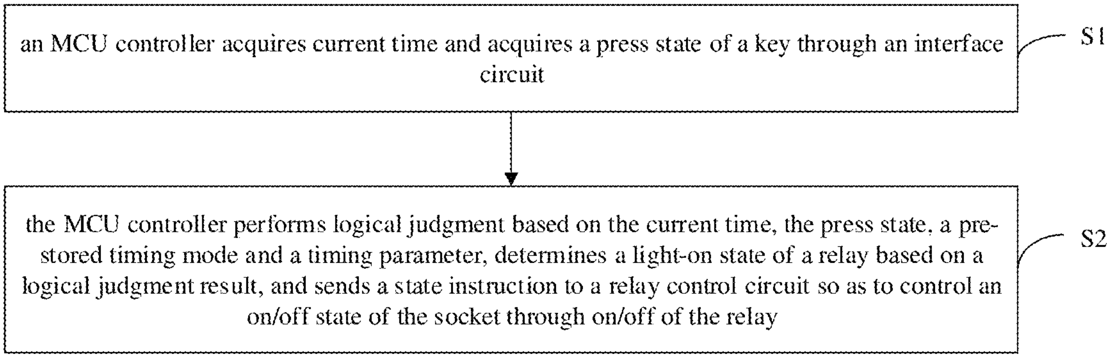
FIG. 2 is a flowchart of a timing setting method according to an embodiment of the application.

FIG. 1 and FIG. 2 are an electronic timer socket provided according to embodiments of the application, which includes a battery 1, a key 2, an MCU controller 3, a relay 4, a relay control circuit 5, an AC/DC conversion circuit 6, a battery voltage monitoring circuit 7, an LCD screen 8, a memory chip 9 and an interface circuit 10. The battery is connected to the MCU controller through the battery voltage monitoring circuit. The key, the LCD screen and the relay control circuit are connected to the MCU controller. The memory chip and the relay are connected with the relay control circuit. A peripheral circuit and a casing are further included. The above-mentioned components are connected according to electrical characteristics and structural features. A core component is the MCU controller.

The battery is configured to supply power to the MCU controller.

The AC/DC conversion circuit is configured to convert alternating current into direct current, input the direct current to the MCU controller and charge the battery at the same time.

The battery voltage monitoring circuit is configured to monitor battery voltage, judge whether a low-voltage alarm is needed or not, and if so, send the low-voltage alarm to the MCU controller so as to enable the MCU controller to execute corresponding alarm operation. The alarm operation includes that: if the battery is less than 10%, the LCD screen is controlled to display a low-power icon and blink; and if the battery is less than 5%, the LCD screen is controlled to display the low-power icon and blink quickly until the battery is replaced.

The interface circuit is connected with the MCU controller, and the key is connected with the MCU controller through the interface circuit.

The LCD screen is connected with the MCU controller, and is configured to display timer time and operation state. A plurality of keys are matched with the display of the LCD screen. A one-way socket which needs timing setting is selected first, the timing mode of an electronic timing remote control is set, then the timing parameter is set in the timing mode, and the timing mode and the timing parameter are sent to the controller and stored.

The memory chip is configured to store the preset timing mode and a mode parameter.

The MCU controller is configured to detect the state of the key, acquire current time, perform logical judgment based on the state of the key, the current time and the preset timing mode, determine a light-on state of the relay based on a logical judgment result, and send a state instruction to the relay control circuit. The MCU controller acquires the current time and displays same through the LCD screen, the MCU controller detects the state of the key through the interface circuit, and the MCU controller acquires the timing mode from the memory chip through the relay control circuit and displays same through the LCD screen.

The relay control circuit is configured to control and change the on-off state of the corresponding relay based on the state instruction, so as to control the on/off state of the socket. In the embodiment, one or more relays are included, which may independently control one-way or multi-way (for example, two-way) socket circuit to be turned on or off.

In the embodiment, the timing mode includes a user-defined timing mode, a Daily timing mode, a 7-Day cycle timing mode, a CTD timing mode and a normally-on/normally-off timing mode.

The user-defined timing mode is configured to set the on/off state by itself.

The Daily timing mode is configured to set the daily on/off state.

The 7-Day cycle timing mode is configured to set the on/off state from Monday to Sunday.

The CTD timing mode is configured to perform sampling according to a set sampling frequency and then enter the on/off state within a set time interval.

In the embodiment, the logical judgment includes a multi-mode parallel or serial discrimination rule. The multi-mode parallel or serial discrimination rule includes the following operations.

The user-defined timing mode is capable of being used in the Daily timing mode and the 7-Day cycle timing mode.

The Daily timing mode is mutually exclusive with the 7-Day cycle timing mode and the normally-on/normally-off timing mode, and when the Daily timing mode is activated, the 7-Day cycle timing mode or the normally-on/normally-off timing mode is automatically exited.

The 7-Day cycle timing mode is mutually exclusive with the Daily timing mode and the normally-on/normally-off timing mode, and when the 7-Day cycle timing mode is activated, the Daily timing mode or the normally-on/normally-off timing mode is automatically exited.

The CTD timing mode is capable of operating parallel to the Daily timing mode, the 7-Day cycle timing mode and the user-defined timing mode, and the user-defined timing mode, the Daily timing mode, the 7-Day cycle timing mode and the CTD timing mode are capable of being activated at the same time.

The CTD timing mode and the normally-on/normally-off timing mode are mutually exclusive, and when the normally-on/normally-off timing mode is used, the CTD timing mode is automatically exited.

When the CTD timing mode and the user-defined timing mode are activated at the same time, execution is performed according to the function of the user-defined timing mode.

When the user-defined timing mode, the Daily timing mode, the 7-Day cycle timing mode and the CTD timing mode are in an active state, the normally-on/normally-off timing mode is triggered, and the normally-on/normally-off timing mode is directly executed.

Figure 3:
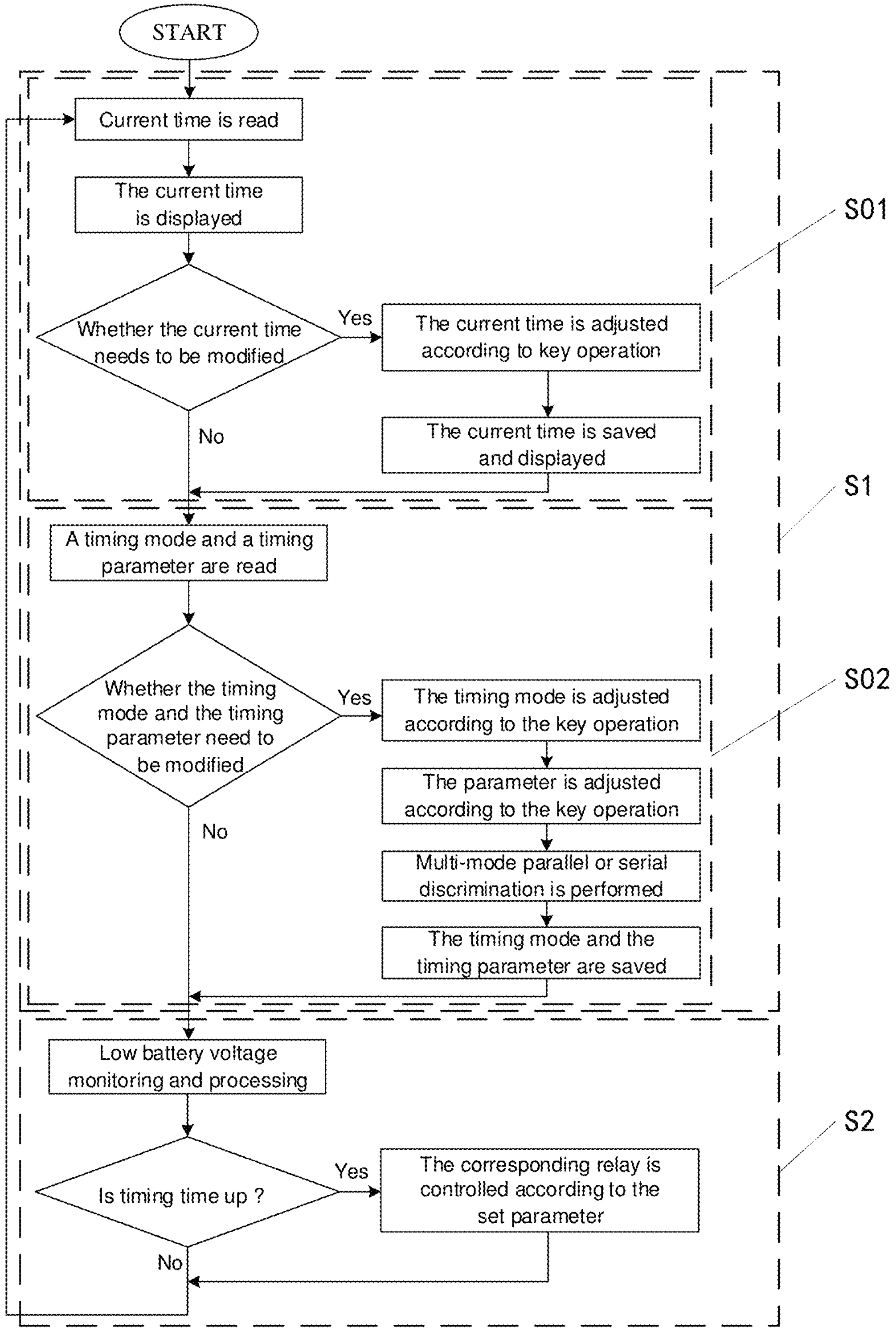
FIG. 3 is the specific flow diagram in FIG. 2 of the application.

The embodiment of the application further provides a timing setting method of the electronic timer socket according to the above-mentioned embodiment. The timing setting method may also be applied to the electronic timer socket. As shown in FIG. 2 and FIG. 3, the timing setting method includes the following operations.

At S1, an MCU controller acquires current time and acquires a press state of a key through an interface circuit.

At S2, the MCU controller performs logical judgment based on the current time, the press state, a pre-stored timing mode and a timing parameter, determines a light-on state of a relay based on a logical judgment result, and sends a state instruction to a relay control circuit so as to control an on/off state of the socket through on/off of the relay.

Based on the above-mentioned embodiment, as a preferred implementation mode, in S1, the operation that the MCU controller acquires the current time further includes the following operation.

The current time is updated/set, the updated/set current time is sent to the MCU controller for storage, and the MCU controller displays a time value on an LCD screen based on the current time.

Figure 4:
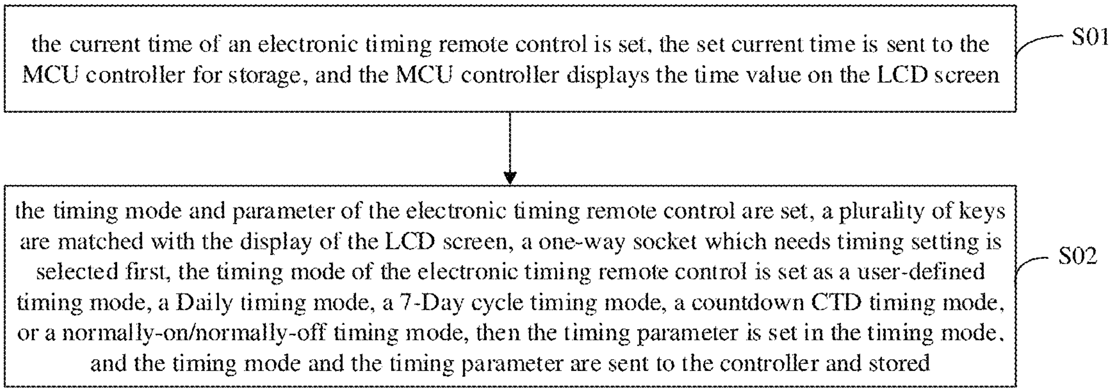
FIG. 4 is specific flow diagram of setting timing mode and parameters of electronic timing remote control before step S1 of the application.

Before S1, as shown in FIG. 4, the following steps are added.

At S01, the current time of an electronic timing remote control is set, the set current time is sent to the MCU controller for storage, and the MCU controller displays the time value on the LCD screen.

S01 also includes the step of reading the current time of the electronic timing remote control, judging whether it is necessary to modify the current time, and if so, setting the current time of the electronic timing remote control with a key.

At S02, the timing mode and parameter of the electronic timing remote control are set, a plurality of keys are matched with the display of the LCD screen, a one-way socket which needs timing setting is selected first, the timing mode of the electronic timing remote control is set as a user-defined timing mode, a Daily timing mode, a 7-Day cycle timing mode, a CTD timing mode, or a normally-on/normally-off timing mode, then the timing parameter is set in the timing mode, and the timing mode and the timing parameter are sent to the controller and stored.

The MCU controller acquires the current time and displays same through the LCD screen, the MCU controller detects the state of the key through the interface circuit, and the MCU controller acquires the timing mode from the memory chip through the relay control circuit and displays same through the LCD screen.

The multi-mode parallel or serial discrimination rule includes the following operations.

The user-defined timing mode is capable of being used in the Daily timing mode and the 7-Day cycle timing mode.

The Daily timing mode is mutually exclusive with the 7-Day cycle timing mode and the normally-on/normally-off timing mode, and when the Daily timing mode is activated, the 7-Day cycle timing mode or the normally-on/normally-off timing mode is automatically exited.

The 7-Day cycle timing mode is mutually exclusive with the Daily timing mode and the normally-on/normally-off timing mode, and when the 7-Day cycle timing mode is activated, the Daily timing mode or the normally-on/normally-off timing mode is automatically exited.

The CTD timing mode is capable of operating parallel to the Daily timing mode, the 7-Day cycle timing mode and the user-defined timing mode, and the user-defined timing mode, the Daily timing mode, the 7-Day cycle timing mode and the CTD timing mode are capable of being activated at the same time.

The CTD timing mode and the normally-on/normally-off timing mode are mutually exclusive, and when the normally-on/normally-off timing mode is used, the CTD timing mode is automatically exited.

When the CTD timing mode and the user-defined timing mode are activated at the same time, execution is performed according to the function of the user-defined timing mode.

When the user-defined timing mode, the Daily timing mode, the 7-Day cycle timing mode and the CTD timing mode are in an active state, the normally-on/normally-off timing mode is triggered, and the normally-on/normally-off timing mode is directly executed.

Figure 5:
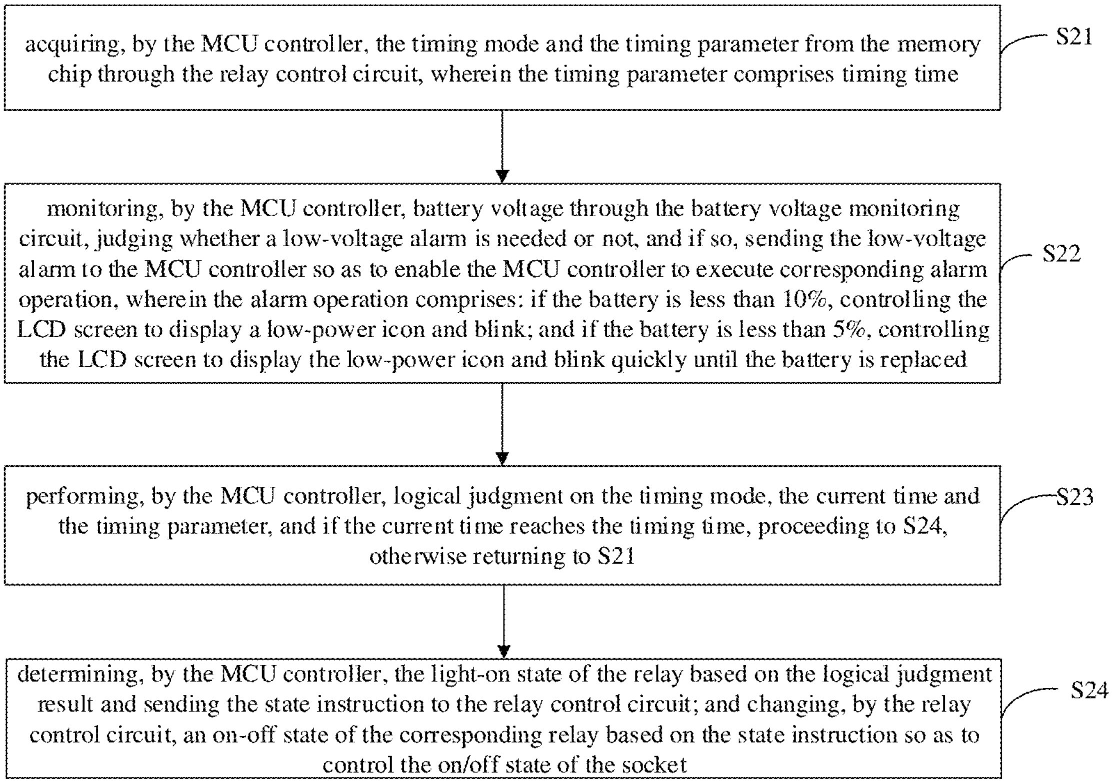
FIG. 5 is the specific flow diagram of step S2 of the application.

Based on the above-mentioned embodiment, as a preferred implementation mode, As shown in FIG. 5, S2 specifically includes the following operations.

At S21, the MCU controller acquires the timing mode and the timing parameter from the memory chip through the relay control circuit. The timing parameter includes timing time.

At S22, the MCU controller monitors battery voltage, judges whether a low-voltage alarm is needed or not, and if so, sends the low-voltage alarm to the MCU controller so as to enable the MCU controller to execute corresponding alarm operation. The alarm operation includes that: if the battery is less than 10%, the LCD screen is controlled to display a low-power icon and blink; and if the battery is less than 5%, the LCD screen is controlled to display the low-power icon and blink quickly until the battery is replaced.

At S23, the MCU controller performs logical judgment on the timing mode, the current time and the timing parameter, if the current time reaches the timing time, proceeding to S24, otherwise returning to S21.

At S24, the MCU controller determines the light-on state of the relay based on the logical judgment result and sends the state instruction to the relay control circuit; and the relay control circuit changes the on-off state of the corresponding relay based on the state instruction so as to control the on/off state of the socket.

The embodiment gives a specific application embodiment on the basis of all the above embodiments. In the embodiment, the electronic timer socket in the application is used to perform timing switch control on the power supply of an office printer, which includes the following steps.

a) A cursor is moved to 7-DAY, entering 7-DAY setting (the content displayed at this time is Monday to Sunday, P1-P5, clock -:--).
b) The cursor blinks on mo, and left or right is pressed to move the cursor from Monday to Sunday. Assuming that Wednesday is set, the cursor blinks on WE, confirming and entering a next line. (A WE cursor lights up.)
c) The cursor blinks on P1, and the left or right is pressed to move the cursor to P1-P5. Assuming that P3 is set, the cursor stays at P3 and blinks, confirming the setting of P3ON hour (a P3 cursor lights up). At this time, the hour blinks, and left or right is pressed to adjust the hour. Hour confirmation is performed, the minute blinks, the left or right is pressed to adjust the minute, and minute confirmation is performed. P1OFF starts to be set. Confirmation is performed after completion, and the cursor returns to P2 and blinks.
d) The cursor may move up, down, left and right when blinking.
e) If set is pressed, setting is completed, returning to a clock interface.

The above steps are repeated to set the electronic timer socket to turn on the power of the office printer from 8:00 to 18:00 every Monday to Friday, and turn off the power of the office printer from 18:00 to 8:00 the next day.

It is to be seen from the above specific application examples, the novel electronic timing remote control in the application meets the requirements of safe and energy-saving use of printers in office places by setting the 7-Day cycle timing mode, and has the advantages of simple setting and convenience for operation.

In conclusion, the embodiments of the application provide an electronic timer socket and a timing setting method thereof. The user-defined timing mode, the Daily timing mode, the 7-Day cycle timing mode, the CTD timing mode and the normally-on/normally-off timing mode are provided through key setting, and the two-way socket circuit may be independently controlled to be turned on or off through the above modes, so that the advantages of simple setting and convenience for operation are achieved, the learning difficulty of using products is reduced, and greater convenience is brought for the public to use. Through the above-mentioned modes and the multi-mode parallel or serial discrimination rule, the two-way socket circuit may be independently controlled to be turned on or off, which has the advantages of simple setting and convenience for operation, making the use of the timer socket more flexible and more suitable for more scenarios.

The embodiments may be implemented completely or partially through software, hardware, firmware or any combination thereof. During implementation with the software, the embodiments may be implemented completely or partially in form of a computer program product. The computer program product includes one or more computer instructions. When the computer program instruction is loaded and executed on a computer, the flows or functions according to the application are completely or partially generated. The computer may be a universal computer, a dedicated computer, a computer network, or another programmable device. The computer instructions may be stored in a computer-readable storage medium or transmitted from one computer-readable storage medium to another computer-readable storage medium. For example, the computer instructions may be transmitted from one website, computer, server or data center to another website, computer, server or data center in a wired (for example, coaxial cable, optical fiber and Digital Subscriber Line (DSL) or wireless (for example, infrared, wireless and microwave) manner. The computer-readable storage medium may be any available medium accessible for the computer or data storage equipment including one or more integrated available media such as a server and a data center. The available medium may be a magnetic medium (for example, a floppy disk, a hard disk and a magnetic tape), an optical medium (for example, a Digital Versatile Disc (DVD), a semiconductor medium (for example, a Solid State Disk (SSD)) or the like.

Those of ordinary skill in the art may understand that implementation of all or part of the processes in the above embodiment method may be completed by instructing related hardware through a computer program, and the program may be stored in a computer-readable storage medium. The program, when executed, may include the processes of the embodiments of the above methods. The foregoing storage medium includes various media that can store program codes, such as a Read Only Memory (ROM), a RAM, a magnetic disk or an optical disc.

The last thing to be noted is: the above embodiments are only used to illustrate the technical solutions of the application and not used to limit the same. Although the application has been described in detail with reference to the foregoing embodiments, for those skilled in the art, they can still modify the technical solutions described in the foregoing embodiments, or equivalently replace part of the technical features; all these modifications and replacements shall not cause the essence of the corresponding technical solutions to depart from the spirit and scope of protection of the application.

What is claimed is:

1. An electronic timer socket, comprising a battery, a key, a Micro-Controller Unit (MCU), a relay, a relay control circuit and an Alternating Current/Direct Current (AC/DC) conversion circuit, wherein the battery is connected to a MCU through a battery voltage monitoring circuit, the key, a Liquid Crystal Display (LCD) screen and the relay control circuit are connected to the MCU;

the battery is configured to supply power to the MCU;

the AC/DC conversion circuit is configured to convert alternating current into direct current, input the direct current to the MCU and charge the battery at a same time;

the MCU is configured to detect a state of the key, acquire current time, perform logical judgment based on the state of the key, the current time and a preset timing mode, determine a light-on state of the relay based on a logical judgment result, and send a state instruction to the relay control circuit; and the relay control circuit is configured to control and change an on/off state of the corresponding relay based on the state instruction, so as to control an on/off state of the socket;

wherein the electronic timer socket further comprises the LCD screen, a memory chip and an interface circuit, wherein the interface circuit is connected with the MCU, the key is connected with the MCU through the interface circuit;

the LCD screen is connected with the MCU, and is configured to display a timer time and operation state; and the memory chip is configured to store the preset timing mode and a mode parameter;

wherein the timing mode comprises one or more of the following modes: a user-defined timing mode, a Daily timing mode, a 7-Day cycle timing mode, a countdown (CTD) timing mode and a normally-on/normally-off timing mode, wherein the user-defined timing mode is configured to set the on/off state of the relay by itself;

the Daily timing mode is configured to set the daily on/off state of the relay;

the 7-Day cycle timing mode is configured to set the on/off state of the relay from Monday to Sunday; and the CTD timing mode is configured to perform sampling according to a set sampling frequency and then enter the on/off state of the relay within a set time interval.

2. The electronic timer socket according to claim 1, further comprising the battery voltage monitoring circuit, wherein the battery voltage monitoring circuit is configured to monitor battery voltage, judge whether a low-voltage alarm is needed or not, and when the low-voltage alarm is needed, send the low-voltage alarm to the MCU so as to enable the MCU to execute corresponding alarm operation, wherein the alarm operation comprises:

when the battery voltage is less than 10%, controlling the LCD screen to display a low-power icon and blink; and when the battery voltage is less than 5%, controlling the LCD screen to display the low-power icon and blink until the battery is replaced.

3. The electronic timer socket according to claim 1, wherein the logical judgment comprises a multi-mode parallel or serial discrimination rule, the multi-mode parallel or serial discrimination rule comprising:

the user-defined timing mode being capable of being used in the Daily timing mode and the 7-Day cycle timing mode;

the Daily timing mode being mutually exclusive with the 7-Day cycle timing mode and the normally-on/normally-off timing mode, and when the Daily timing mode is activated, the 7-Day cycle timing mode or the normally-on/normally-off timing mode being automatically exited;

the 7-Day cycle timing mode being mutually exclusive with the Daily timing mode and the normally-on/normally-off timing mode, and when the 7-Day cycle timing mode is activated, the Daily timing mode or the normally-on/normally-off timing mode being automatically exited;

the CTD timing mode being capable of operating parallel to the Daily timing mode, the 7-Day cycle timing mode and the user-defined timing mode, and the user-defined timing mode, the Daily timing mode, the 7-Day cycle timing mode and the CTD timing mode being capable of being activated at a same time;

the CTD timing mode and the normally-on/normally-off timing mode being mutually exclusive, and when the normally-on/normally-off timing mode is used, the CTD timing mode being automatically exited;

when the CTD timing mode and the user-defined timing mode are activated at a same time, execution being performed according to a function of the user-defined timing mode; and when the user-defined timing mode, the Daily timing mode, the 7-Day cycle timing mode and the CTD timing mode are in an active state, the normally-on/normally-off timing mode being triggered, and the normally-on/normally-off timing mode being directly executed.

4. A timing setting method of the electronic timer socket according to claim 1, comprising:

acquiring, by the Micro-Controller Unit (MCU), a current time and acquiring a press state of a key through an interface circuit; and performing, by the MCU, logical judgment based on the current time, the press state, a pre-stored timing mode and a timing parameter, determining a light-on state of a relay based on the logical judgment result, and sending a state instruction to the relay control circuit so as to control an on/off state of the socket by turning on/off of the relay.

5. The timing setting method of the electronic timer socket according to claim 4, wherein performing, by the MCU, logical judgment based on the current time, the press state, a pre-stored timing mode and a timing parameter, determining a light-on state of a relay based on the logical judgment result, and sending a state instruction to the relay control circuit so as to control an on/off state of the socket by turning on/off of the relay comprises:

acquiring, by the MCU, the timing mode and the timing parameter from the memory chip through the relay control circuit, wherein the timing parameter comprises timing time;

monitoring, by the MCU, battery voltage through the battery voltage monitoring circuit, judging whether a low-voltage alarm is needed or not, and when the low-voltage alarm is needed, sending the low-voltage alarm to the MCU so as to enable the MCU to execute a corresponding alarm operation, wherein the alarm operation comprises: when the battery voltage is less than 10%, controlling the LCD screen to display a low-power icon and blink; and when the battery voltage is less than 5%, controlling the LCD screen to display the low-power icon and blink until the battery is replaced;

performing, by the MCU, logical judgment on the timing mode, the current time and the timing parameter, and when the current time reaches the timing time, proceeding, otherwise returning to acquiring; and determining, by the MCU, the light-on state of the relay based on the logical judgment result and sending the state instruction to the relay control circuit; and changing, by the relay control circuit, an on-off state of the corresponding relay based on the state instruction so as to control an on/off state of the socket.

6. The timing setting method of the electronic timer socket according to claim 4, wherein acquiring, by the MCU, the current time further comprises:

updating/setting the current time, sending the updated/set the current time to the MCU for storage, and displaying, by the MCU, a time value on the Liquid Crystal Display (LCD) screen based on the current time.

7. The timing setting method of the electronic timer socket according to claim 6, after displaying, by the MCU, the time value on the LCD screen based on the current time, further comprising:

determining the timing mode and the timing parameter based on a key signal of the key to determine the socket needing timing setting;

setting the timing mode as a user-defined timing mode, a Daily timing mode, a 7-Day cycle timing mode, a CTD timing mode or a normally-on/normally-off timing mode based on a multi-mode parallel or serial discrimination rule;

sending the timing mode and the timing parameter to the MCU and storing in athe memory chip.

8. The timing setting method of the electronic timer socket according to claim 7, wherein the multi-mode parallel or serial discrimination rule comprises:

the user-defined timing mode being capable of being used in the Daily timing mode and the 7-Day cycle timing mode;

the Daily timing mode being mutually exclusive with the 7-Day cycle timing mode and the normally-on/normally-off timing mode, and when the Daily timing mode is activated, the 7-Day cycle timing mode or the normally-on/normally-off timing mode being automatically exited;

the 7-Day cycle timing mode being mutually exclusive with the Daily timing mode and the normally-on/normally-off timing mode, and when the 7-Day cycle timing mode is activated, the Daily timing mode or the normally-on/normally-off timing mode being automatically exited;

the CTD timing mode being capable of operating parallel to the Daily timing mode, the 7-Day cycle timing mode and the user-defined timing mode, and the user-defined timing mode, the Daily timing mode, the 7-Day cycle timing mode and the CTD timing mode being capable of being activated at a same time;

the CTD timing mode and the normally-on/normally-off timing mode being mutually exclusive, and when the normally-on/normally-off timing mode is used, the CTD timing mode being automatically exited;

when the CTD timing mode and the user-defined timing mode are activated at a same time, execution being performed according to a function of the user-defined timing mode; and when the user-defined timing mode, the Daily timing mode, the 7-Day cycle timing mode and the CTD timing mode are in an active state, the normally-on/normally-off timing mode being triggered, and the normally-on/normally-off timing mode being directly executed.

* * * * *